(12) United States Patent
Nomura et al.

(10) Patent No.: US 9,049,786 B2
(45) Date of Patent: Jun. 2, 2015

(54) CERAMIC SUBSTRATE AND METHOD FOR MANUFACTURING THE SAME

(75) Inventors: Toshihisa Nomura, Kasugai (JP); Kenji Suzuki, Ichinomiya (JP); Kazushige Akita, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 413 days.

(21) Appl. No.: 13/436,005

(22) Filed: Mar. 30, 2012

(65) Prior Publication Data

US 2012/0247821 A1 Oct. 4, 2012

(30) Foreign Application Priority Data

Apr. 1, 2011 (JP) ................. 2011-082161

(51) Int. Cl.
| | |
|---|---|
| H05K 1/11 | (2006.01) |
| H05K 3/42 | (2006.01) |
| H05K 1/02 | (2006.01) |
| H05K 1/03 | (2006.01) |
| H05K 3/00 | (2006.01) |
| H05K 3/40 | (2006.01) |

(Continued)

(52) U.S. Cl.
CPC ............. *H05K 1/0287* (2013.01); *Y10T 156/11* (2015.01); *H05K 3/429* (2013.01); *H05K 1/115* (2013.01); *H05K 1/0306* (2013.01); *H05K 3/005* (2013.01); *H05K 3/4061* (2013.01); *H05K 2201/0949* (2013.01); *H05K 2201/09609* (2013.01); *H05K 2201/0979* (2013.01); *G01R 1/07342* (2013.01); *G01R 3/00* (2013.01)

(58) Field of Classification Search
CPC .... H05K 1/0268; H05K 1/0306; H05K 1/115
See application file for complete search history.

(56) References Cited

U.S. PATENT DOCUMENTS

| | | | |
|---|---|---|---|
| 2006/0086703 A1* | 4/2006 | Liu et al. ................. | 219/121.72 |
| 2009/0200067 A1 | 8/2009 | Nozu | |

FOREIGN PATENT DOCUMENTS

| | | |
|---|---|---|
| JP | H10-65345 A | 3/1998 |
| JP | 2002-257858 A | 9/2002 |

(Continued)

OTHER PUBLICATIONS

Machine translation of JP 2002-257858A, Ido, Sep. 11, 2002.*

(Continued)

*Primary Examiner* — Jeremy C Norris
(74) *Attorney, Agent, or Firm* — Stites & Harbison PLLC; Jeffrey A. Haeberlin

(57) ABSTRACT

A ceramic substrate for an electronic part inspecting apparatus that can be manufactured in accordance with predetermined specifications, regardless of the number and location of pins required, relatively quickly and inexpensively is provided. In certain embodiments the ceramic substrate is configured to connect to a probe for inspecting an electronic component, and the ceramic substrate comprises a plurality of vias located in a center area of the ceramic substrate that penetrate through the ceramic substrate in its thicknesswise direction, pads located in an outer periphery that surrounds the center area where the vias are located, the pads being configured to connected to the probes, and a conductive layer located only over the front surface of the ceramic substrate and connects the vias to the respective pads. Certain embodiments comprise a greater number of vias than pins. A method of manufacturing the ceramic substrate is also provided.

5 Claims, 6 Drawing Sheets

(51) Int. Cl.
   *G01R 1/073*   (2006.01)
   *G01R 3/00*   (2006.01)

(56) References Cited

FOREIGN PATENT DOCUMENTS

| JP | 2003-060358 A | 2/2003 |
| JP | 2009-074823 A | 4/2009 |
| JP | 2009-188009 A | 8/2009 |
| JP | 2010-043898 A | 2/2010 |

OTHER PUBLICATIONS

JPO, Notification of Reasons for Refusal issued in corresponding application 2011-082161, dispatched Dec. 17, 2013.

* cited by examiner

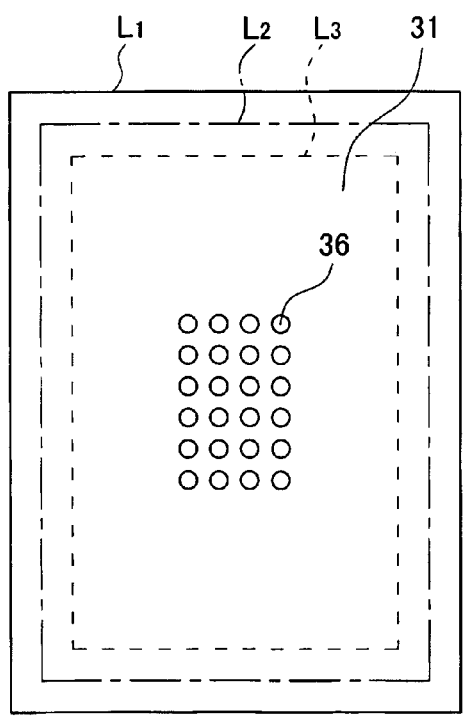 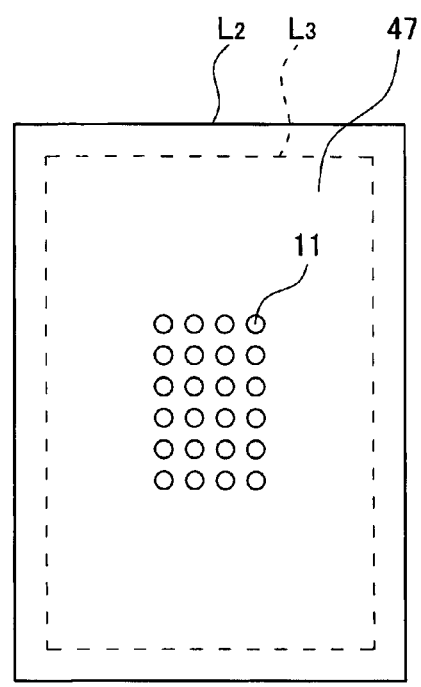

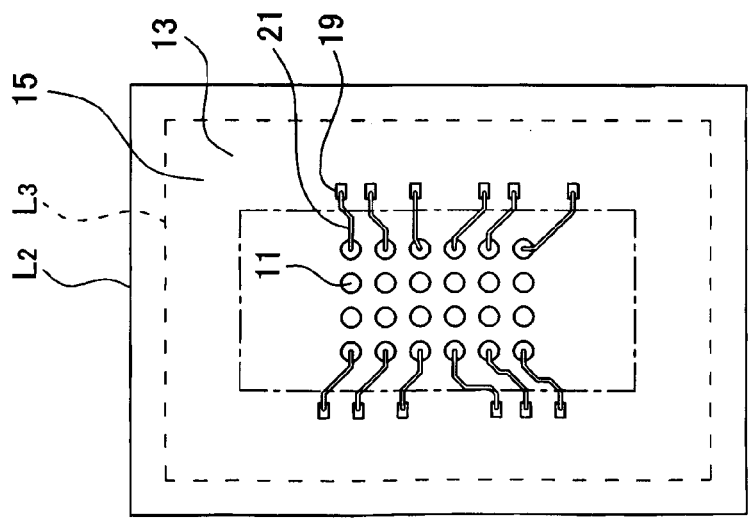
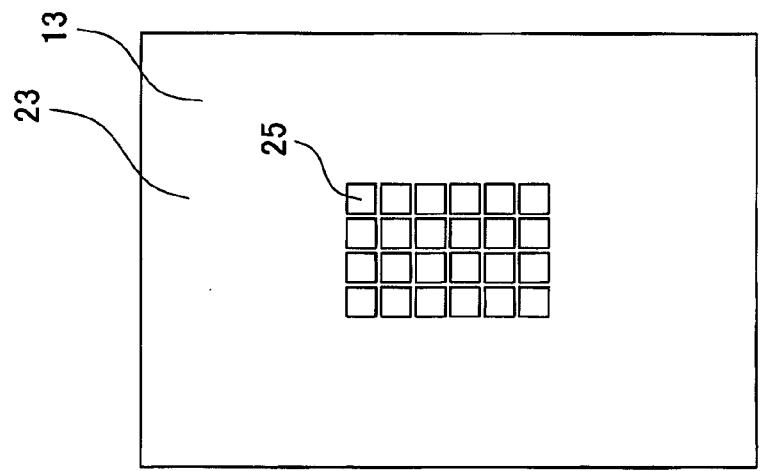
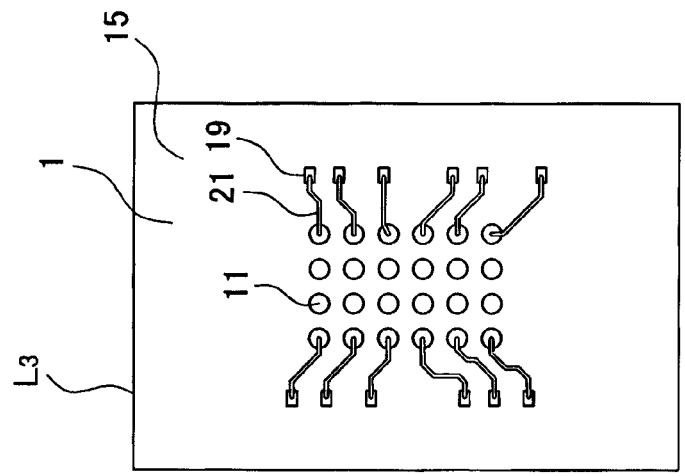

CERAMIC SUBSTRATE AND METHOD FOR MANUFACTURING THE SAME

CROSS REFERENCE TO RELATED APPLICATIONS

The present invention claims priority from Japanese Patent Application No. 2011-082161, which was filed on Apr. 1, 2011, the disclosure of which is herein incorporated by reference in its entirety.

BACKGROUND OF THE INVENTION

1. Field of the Invention

The present invention relates to a ceramic substrate employed in an apparatus for inspecting electronic components, for instance, a probe card, and a method for manufacturing the ceramic substrate.

2. Description of Related Art

A multilayer ceramic substrate made of a plurality of ceramic layers has hitherto been used as a substrate for a probe card that is one of the pieces of an electronic component inspection apparatus.

A plurality of vias (filled with a conductive material) and internal wiring layers connected to the vias are provided in the ceramic substrate. A plurality of pads connected to the respective vias is formed on a surface of the ceramic substrate (see Patent Document 1).

In the probe card, microscopical probes are connected onto pads on a ceramic substrate. The probes are brought into contact with the electrodes of a plurality of semiconductor chips (e.g., IC chips) fabricated on, for instance, a silicon wafer, to electrically inspect the semiconductor chips.

When the ceramic substrate is manufactured, a plurality of ceramic green sheets (corresponding to ceramic layers) having (unsintered) vias and internal wiring layers are usually manufactured. The ceramic green sheets are stacked, to thus fabricate a layered product. The layered product is sintered and subsequently separated, thereby forming ceramic substrates having predetermined shapes.

RELATED ART DOCUMENTS

Patent Document 1 is Japanese Patent Application No. 2009-74823.

BRIEF SUMMARY OF THE INVENTION

However, the related-art's technique encounters various problems, such as those that will be mentioned below, and additional betterment of the technique has been desired.

Specifically, in order to form vias in each of the ceramic green sheets corresponding to the respective ceramic layers, metal molds used for making holes (corresponding to the respective vias) in the ceramic green sheets are required. Incidentally, when target ceramic substrates vary in size or when positions of the holes vary, custom-designed metal molds are required for each size and position.

For these reasons, tooling costs are incurred in producing many metal molds. Further, producing metal molds is time consuming. These things result in the prolongation of the period required for producing a ceramic substrate.

Particularly, when the number of ceramic layers is large, the number of required metal molds also increases correspondingly. Even in this respect, the related-art's technique has posed hindrances to cost reducing and the realization of quicker delivery.

The present invention has been conceived to solve these problems and aims at providing a ceramic substrate that enables cost reducing and the shortening of manufacturing time, and also provides a method for manufacturing the same.

A means (Means 1) for solving the above problems is a ceramic substrate configured to connect to probes for inspecting an electronic component, the ceramic substrate comprising: a plurality of vias located in a center area of the ceramic substrate in a planar direction and that penetrate through the ceramic substrate in its thicknesswise direction; pads located in an outer periphery that surrounds the center area where the vias are located, the pads being configured to connect to the probes; and a conductive layer located only over a front surface of the ceramic substrate and connects the vias to the respective pads.

The present invention relates to a ceramic substrate to which probes are not yet connected. A plurality of vias is formed in a center area of the ceramic substrate. Pads to be connected to probes are formed on the outer periphery (e.g., on a rim side) that is outside (e.g. surrounds) the center area where the vias are formed. Further, a conductive layer for connecting the vias to the respective pads is formed only on a front surface of the ceramic substrate.

Accordingly, with a ceramic substrate having this structure, formation of vias, pads, and a conductive layer on a surface of the substrate can be performed through different processes. Therefore, a ceramic substrate having a greater number of vias than the expected number of vias is manufactured in advance. After specifications are determined, pads are formed in a predetermined layout. A conductive layer for connecting some of the vias formed in the center area to the pads located at the outside of the vias can separately be formed.

Specifically, when an internal wiring layer for interconnecting the vias within the ceramic substrate is formed as in the related art, the internal wiring layer must be formed according to specifications after the specifications are determined. However, the structure of the present invention makes it possible to form vias in advance and form a conductive layer only on a surface of the ceramic substrate after specifications are determined.

Accordingly, there is no necessity for preparing metal molds according to various sizes and patterns, which has hitherto been required. Since through holes corresponding to vias (that have previously been set in greater number) can be formed by use of a single metal mold, tooling costs and time consumed in manufacturing ceramic substrates can be greatly reduced.

According to a second embodiment of the present invention, there is a greater number of the vias than the pads.

In a second embodiment of the present invention, the vias are greater in number than the pads. Hence, a conductive layer from a certain pad to a via at a specific location can be easily arranged.

More pads than are expected may be prepared. Accordingly, so long as a single ceramic substrate is manufactured in advance, there will be yielded an advantage of having the ability to cope with specifications of various ceramic substrates.

According to a third embodiment of the present invention, there is provided a method for manufacturing a ceramic substrate having pads configured to connect to probes for inspecting an electronic component, the method comprising: a first step of forming a plurality of via-filled portions that are filled with a via material on a ceramic green sheet; a second step of sintering the ceramic green sheet to form a mother ceramic substrate having a plurality of vias; a third step of forming the pads and a conductive layer for connecting the pads to the vias over a front surface of the mother ceramic substrate; and a fourth step of trimming the mother ceramic substrate to produce the ceramic substrate; wherein there is a greater number of the vias than the pads.

In a third embodiment of the present invention, the via-filled portions, which are filled with a via material, that are greater in number than the pads, are first formed in the ceramic green sheet. Next, the ceramic green sheet having the via-filled portions is sintered, to thus make a mother ceramic substrate having vias. Next, pads and a conductive layer (for connecting pads to the vias) are formed over the surface of the mother ceramic substrate. The mother ceramic substrate is trimmed to an external dimension (i.e., a predetermined external dimension), whereby a ceramic substrate is manufactured.

Accordingly, a mother ceramic substrate having vias that is larger than the eventual ceramic substrate is produced in advance. For instance, according to specifications, pads and a conductive layer are made on the mother ceramic substrate, and the mother ceramic substrate is then trimmed to an external dimension, thereby producing a ceramic substrate. Manufacturing costs and time can thereby be shortened when compared with those required in the related art.

Specifically, a large mother ceramic substrate having vias that are larger in number than a number of pads which are usually used is prepared and stocked in advance. As a result, it is not necessary to prepare a plurality of metal molds corresponding to different sizes and different via layouts, which has hitherto been practiced. Tooling costs and manufacturing time pertaining to metal molds and, by extension, costs and time incurred in manufacturing a ceramic substrate, can be reduced.

As mentioned above, even when a target ceramic substrate varies in size or when holes, which become vias, vary in position, there will be yielded an advantage that a single metal mold can be used in the present manufacturing method. Therefore, there is yielded an advantage of tooling costs and time incurred in producing metal molds being reduced.

According to a fourth embodiment of the present invention, the method of the third embodiment further comprises: separating one or more ceramic green sheets that respectively correspond to the mother ceramic substrates from a large-size ceramic green sheet before the first step; wherein the ceramic green after the separating step has an outside dimension corresponding to that of the mother ceramic substrate whose outside dimension is larger than that of the ceramic substrate.

Hence, ceramic green sheets corresponding to mother ceramic substrates (that are greater in size than ceramic substrates) can thereby be manufactured from one large-size ceramic green sheet.

Characteristics of embodiments of the present invention are hereunder described.

Dimensions ranging from 5 mm long×11 mm wide to 10 mm long×15 mm wide, for instance, can be adopted as the dimension for the planar shape of the ceramic substrate. Further, a range from 0.13 to 0.50 mm, for instance, can be adopted for the thickness of the ceramic substrate.

Depending on the size of the ceramic substrate and the number of vias, a range from 3 mm long×6 mm wide to 6 mm long×8 mm wide can be adopted as the region where the vias are to be arranged (e.g., center area).

Depending on specifications, a range from 21 to 70, for instance, can be adopted as the number of vias to be arranged.

Depending on specifications, a range from 21 to 70, for instance, can be adopted as the number of pads to which the probes can be connected.

Specific examples of a ceramic material making up the ceramic substrate include sintered bodies made up of high-temperature sintered ceramics, like alumina, aluminum nitride, boron nitride, silicon carbide, silicon nitride, and others. In addition, the examples also include sintered bodies made up of low-temperature sintered ceramics, like glass ceramics, which are produced by adding an inorganic ceramic filler, like aluminum, to borosilicate glass or lead borosilicate glass.

No limitations are imposed on the material used for producing the pads. However, it is preferable to form the pads through concurrent sintering operation, using metal which can be sintered simultaneously with the ceramic, such as molybdenum, tungsten, copper, and silver. When a sintered body made up of a low-temperature sintered ceramic is selected, copper, silver, or the like can be used as a material for a pad. The pads can also be separately formed by various methods (e.g., sputtering, plating, CVD, printing, and the like) after sintering of ceramic.

No particular limitations are imposed on the material for a via conductor making up the vias. However, use of metal that can be sintered simultaneously with ceramic; for instance, molybdenum and tungsten, is appropriate. When a sintered body made up of low-temperature ceramic is selected, copper, silver, or the like can further be used as a material for making a via conductor.

BRIEF DESCRIPTION OF THE DRAWINGS

Illustrative aspects of the invention will be described in detail with reference to the following figures wherein:

FIG. 6 (6A, 6B) is a view showing procedures for manufacturing the IC inspection apparatus substrate; and FIG. 7 (7A, 7B, 7C) is a view showing procedures for manufacturing the IC inspection apparatus substrate.

DETAILED DESCRIPTION OF EXEMPLARY EMBODIMENTS OF THE INVENTION

An embodiment of the present invention is hereunder described.

Embodiment

A ceramic substrate is described hereunder by describing the substrate of an IC chip inspection apparatus (hereinafter "IC inspection apparatus substrate") as an example.

The IC inspection apparatus substrate is to be set on an apparatus (e.g., an IC inspection apparatus) that electrically inspects a silicon wafer at a plurality of locations at which ICs are fabricated.

Structure

First, the structure of the IC inspection apparatus substrate of the present embodiment is described.

Figure 1:
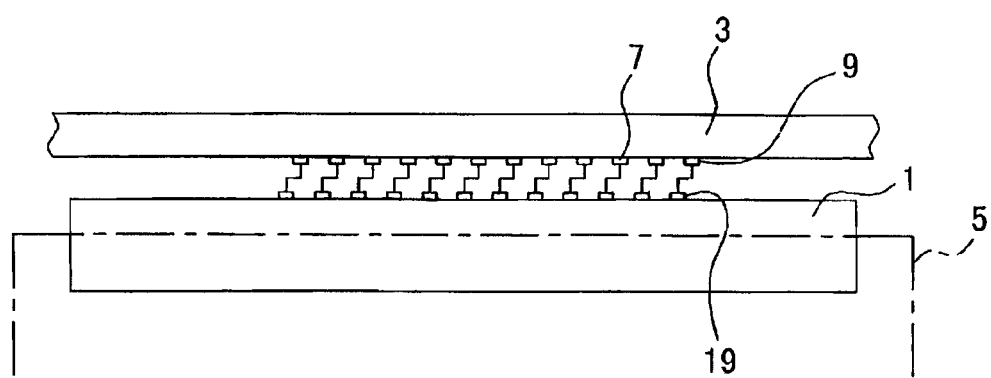
FIG. 1 is a view showing a substrate for an IC inspection apparatus (hereinafter "IC inspection apparatus substrate") of an embodiment in use.

As schematically shown in FIG. 1, a substrate 1 for use in the IC inspection apparatus substrate of the present embodiment is to be set on an IC inspection apparatus 5 that electrical inspects a silicon wafer 3 at a plurality of locations at which ICs are fabricated. A plurality of fine probes 9 to be brought into contact with terminals 7 of the respective ICs are set on a surface of the IC inspection apparatus substrate 1.

Figure 2A:
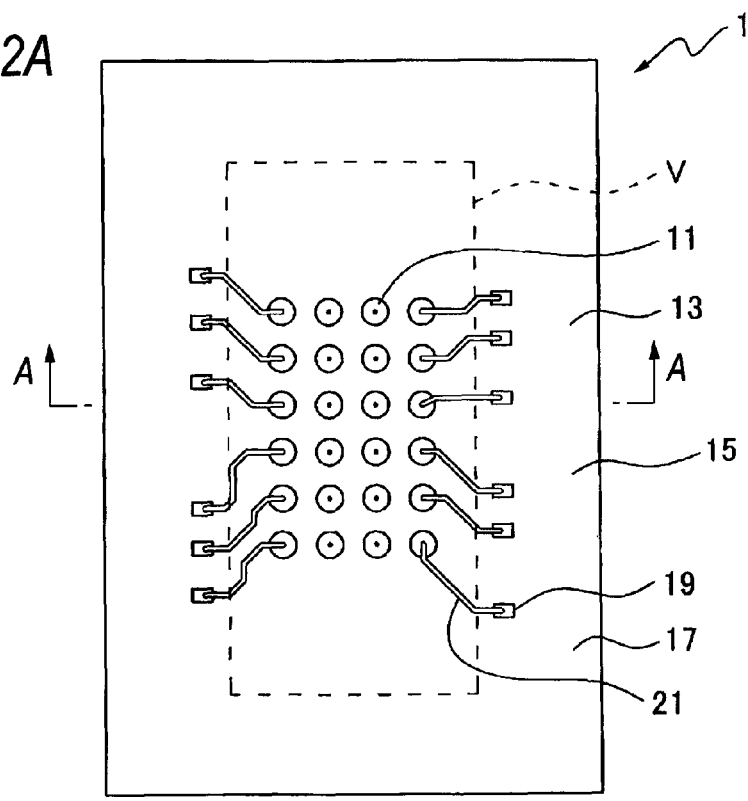
FIG. 2A is a plan view of the IC inspection apparatus substrate.
Figure 2B:
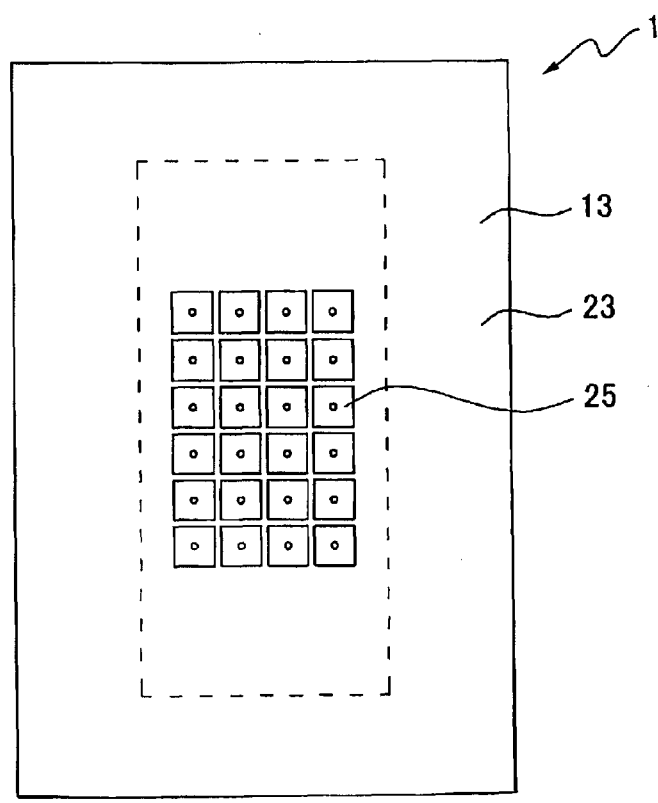
FIG. 2B is a bottom view of the IC inspection apparatus substrate.
Figure 3:
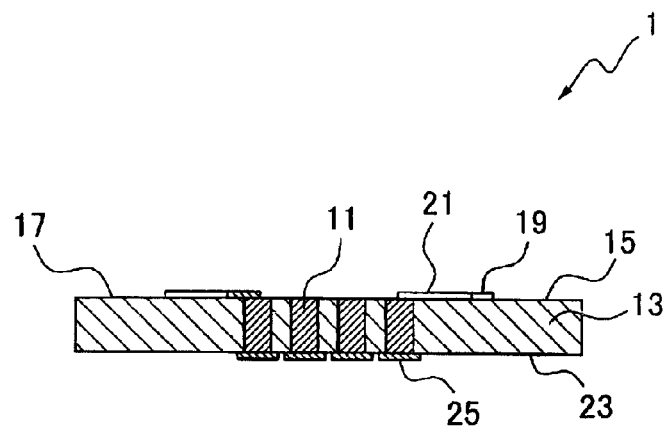
FIG. 3 is a cross sectional view showing a cross section of the IC inspection apparatus substrate shown in FIG. 2A taken along line A-A.

As shown in FIGS. 2 and 3, the IC inspection apparatus substrate 1 is a rectangular plate-like ceramic substrate measuring; for instance, 15 mm long×10 mm wide×1.5 mm thick.

A plurality of vias 11 penetrating through the IC inspection apparatus substrate 1 in its thicknesswise direction are formed in a center area of the IC inspection apparatus substrate 1. Specifically, in the IC inspection apparatus substrate 1, a via layout area (shown as an area surrounded by a broken line) V, measuring, for instance, 11 mm long x 5 mm wide, is set in the center area of a substrate body 13 made from insulating alumina. The vias 11, each of which has a diameter of 0.1 mm, are arranged in a 4-by-6 matrix at a pitch of, for instance, 1.0 mm within the via layout area V.

A square outer periphery 17 (e.g., outside the center area) is set on a first principal surface 15 on a front side, or an inspection side, of the IC inspection apparatus substrate 1, so as to surround a circumference of the via layout area V. A plurality of front-side pads 19 are formed in the outer periphery 17. The probes 9 made from conductive metal are connected to respective front-side pads 19. Each of the front-side pads 19 assumes a rectangular planar shape measuring 0.15 mm long×0.3 mm wide. For example, two columns of six front-side pads 19 are arranged, each of the column of six front-side pads 19 being arranged on each side of the via layout area V as shown in FIG. 2A.

Although unillustrated, each of the front-side pads 19 is made up of, as is well known, a metallic foundation layer which is made by, for instance, two layers, a copper plated layer (a copper layer), a nickel plated layer (a nickel layer) and a gold plated layer (a gold layer).

The metallic foundation layer is made by stacking a titanium sputtered layer and a copper sputtered layer that are different types of metallic layers. The copper plated layer is a plated layer that is made by means of covering an upper surface of a copper sputtered layer by electrolytic copper plating. The nickel plated layer is a planting layer that is made by means of covering an upper surface of the copper plated layer by electrolytic nickel plating. The gold plated layer is a plated layer that is made by means of covering an upper surface of the nickel plated layer by electrolytic gold plating.

Moreover, a surface conductive layer 21 (made from a material similar to that of the front-side pads 19) is formed over the first principal surface 15 of the IC inspection apparatus substrate 1 in such a way that each one of the predetermined vias 11 are connected to one predetermined front-side pad 19. By means of preset specifications, the surface conductive layer 21 is configured to appropriately connect select vias 11 to select front-side pad 19.

In the meantime, as shown in FIG. 2B, back-side pads 25 (made from a material similar to that of the front-side pads 19) are formed on a second principal surface 23 on the back side of the IC inspection apparatus substrate 1 so as to cover end faces of the respective vias 11. The back-side pads 25 may be connected to the IC inspection apparatus 5.

Method for Manufacturing

A method for manufacturing the IC inspection apparatus substrate 1 of the present embodiment is now described.

1) Process for preparing a ceramic green sheet (hereinafter "green sheet").

Figure 4:
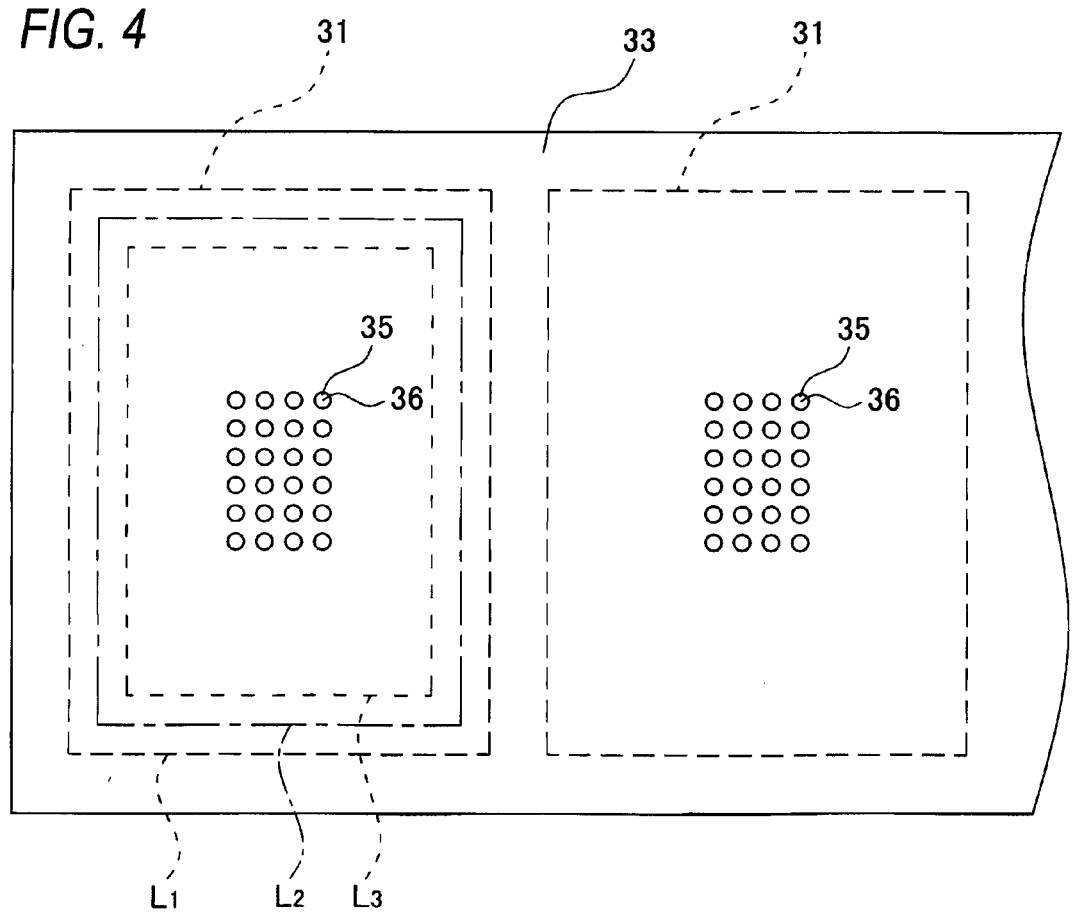
FIG. 4 is a view showing a layout of a large-size green sheet and respective green sheets.

As shown in FIG. 4, in the green sheet preparation process, a green sheet 33 that is larger than a green sheet 31 is prepared in order to prepare at one time a plurality of IC inspection apparatus substrates 1; namely, in such a way that the plurality of green sheets 31 dimensionally corresponding to the IC inspection apparatus substrate 1 can be eventually separated.

Aluminum powder that is a ceramic raw material, an organic solvent, an organic binder, and the like, are subjected to wet blending in a pot, thereby producing a slurry used for making a large-size green sheet 33.

Next, the slurry used for preparing a green sheet is taken as a raw material, and the slurry is thinly cast over the predetermined sheet in a uniform thickness by use of a hitherto well-known casting apparatus.

Subsequently, the sheet-like cast slurry is heated and dried, to thus prepare the green sheet 33. An analogous green sheet can also be prepared by means of a press molding technique instead of such a sheet molding technique.

2) Process for preparing a mother ceramic substrate.

Next, the thus-prepared green sheet 33 is bored by means of punching, thereby forming a plurality of through holes (e.g., penetration holes) 35 at predetermined positions (e.g., via formation positions).

Figure 5:
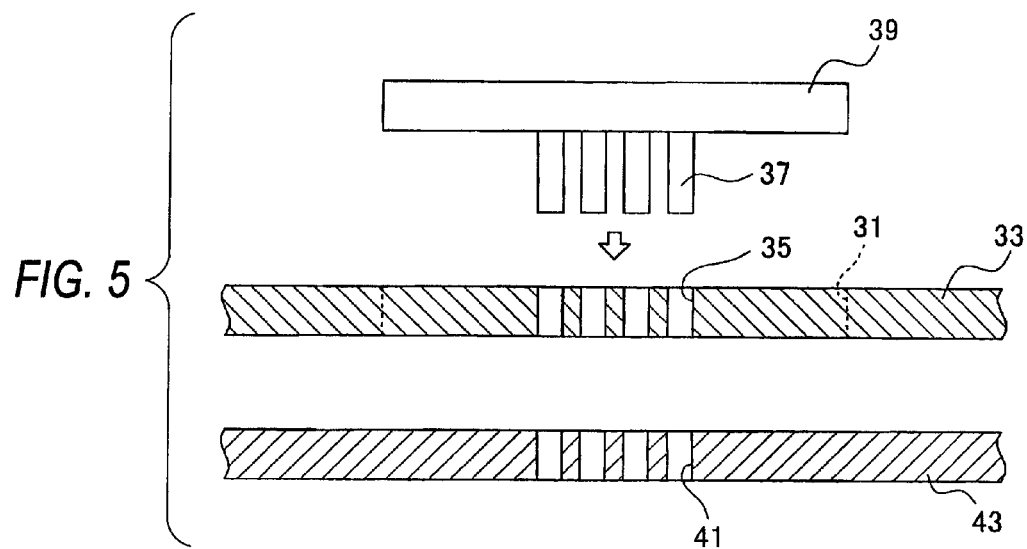
FIG. 5 is a view showing a metal mold used to form through holes.

Specifically, the through holes 35 are opened in a center area of each of the green sheets 31 within the green sheet 33 (e.g., large-size green sheet), by use of an upper metal mold 39 having a plurality of pins 37, which each correspond to the respective through holes 35, such as those shown in FIG. 5, and a lower metal mold 43 having through holes 41 into which the corresponding pins 37 penetrate.

The respective through holes 35 in the thus-bored green sheet 33 are injected with previously-prepared tungsten paste used for forming vias by use of a hitherto-known paste injecting apparatus, thereby forming via-filled portions (e.g., via-charged portions) 36. Subsequently, the paste is dried.

Subsequently, the green sheets 31 are separated along a first line L1 shown in FIG. 4. The green sheets 31 (corresponding to one IC inspection apparatus substrate 1), such as that shown in FIG. 6A, is thereby obtained.

The first line L1, the second line L2, and the third line L3 shown in FIG. 4 are now described. The third line L3 is one that shows a dimension corresponding to a planar shape of the IC inspection apparatus substrate 1. The second line L2 is one that shows a dimension corresponding to a planar shape of a mother ceramic substrate from which the IC inspection apparatus substrate 1, to be described later, is separated. The first line L1 is one set for first separating the green sheets 31. The first line L1 to the third line L3 are set in such a way that their dimensions sequentially become smaller.

Next, as shown in FIG. 6A, the green sheet 31 separated along the first line L1 is heated at 200° C. to 300° C. for 20 to 60 hours in air, to thus be degreased. A binder included in the green sheet 31 is thereby decomposed and removed.

After degreasing, the green sheet 31 is transferred to a sintering apparatus, where the green sheet 31 is heated and sintered for about 24 hours at a temperature where alumina can be sintered (e.g., about 1600° C.). As a result, the alumina and tungsten in a paste are simultaneously sintered.

As a result of sintering, the via-filled portions 36 are turned into vias 11 and the green sheet 31 contracts to thus turn into a sintered substrate (e.g., mother ceramic substrate) 47 that dimensionally corresponding to the second line L2, as shown in FIG. 6B.

The mother ceramic substrate 47 is designed to be larger than IC inspection apparatus substrates 1 of various sizes that are commonly used.

The mother ceramic substrate 47 is stocked until specifications of the IC inspection apparatus substrate 1 are defined. Specifically, manufacturing work may be halted after a process for producing the mother ceramic substrate 47. The mother ceramic substrate 47 of single size may thus be prepared in advance.

3) Process for preparing an IC inspection apparatus substrate.

Next, when manufacture of the IC inspection apparatus substrate 1 may start after determining specifications, the first principal surface 15 and the second principal surface 23 of the mother ceramic substrate 47 are abraded by use of a hitherto well-known surface polisher, thereby enhancing flatness of the first principal surface 15 and the second principal surface 23.

Before stocked, the mother ceramic substrate 47 may also be subjected to surface polishing.

As shown in FIG. 7A, the surface conductive layer 21, which is a thin film, and the front-side pads 19 are formed, for instance, in an integrated fashion or in turns, on the first principal surface 15 of the mother ceramic substrate 47 (more specifically the substrate body 13) so as to connect to the respective vias 11. In addition to this, as shown in FIG. 7B, the back-side pads 25 are formed on the second principal surface 23 of the substrate body 13 so as to cover the respective end faces of the vias 11.

Connection of the vias 11 to the surface pads 19 is performed in accordance with predetermined specifications, and hence the surface conductive layer 21 is formed in conformance with the specifications.

4) Procedures for forming the surface conductive layer.

First, a metallic layer that is made from two metallic layers and that is to act as a metallic foundation layer is formed over the first principal surface 15 and the second principal surface 23 of the substrate body 13. To be more specific, although unillustrated, a sputtering layer made from titanium (i.e., a sputtering layer that is to turn into a titanium sputtered layer) is first formed by sputtering. Next, a sputtering layer made from copper (i.e., a sputtering layer that is to turn into a copper sputtered layer) is formed over the titanium sputtered layer through sputtering.

A plating resist material imparted with photosensitivity is laid over the first principal surface 15 and the second principal surface 23 of the substrate body 13. Further, an exposure mask having a predetermined mask pattern is laid over the plating resist material. The mask pattern is set to correspond to the pattern geometry of any one of the surface conductive layer 21 to be formed, the front-side pads 19, and the back-side pads 25. The plating resist material is exposed through the exposure mask. The thus-exposed plating resist material is developed, to thus form a plating resist. Accordingly, the plating resist assumes the geometry of the surface conductive layer 21, the geometry of the front-side pads 19, or the geometry of the back-side pads 25.

Next, a copper plated layer is formed by means of electrolytic copper plating. Further, a nickel plated layer is formed over the copper plated layer by means of electrolytic nickel plating. Further, a gold plated layer is formed over the nickel plated layer by means of electrolytic gold plating.

Subsequently, after removal of the plated resist, the substrate is etched. As a consequence, a layered body made up of a titanium sputter, a copper sputtered layer, a copper plated layer, a nickel plated layer, and a gold plated layer is thus formed.

The plurality of front-side pads 19 and the surface conductive layer 21 are formed over the first principal surface 15 of the substrate body 13, and the plurality of back-side pads 25 are formed on the second principal surface 23.

The mother ceramic substrate 47 is then separated along the third line L3 so as to assume a size corresponding to the specifications. FIG. 7C shows the completed IC inspection apparatus substrate 1 having the plurality of front-side pads 19 and the surface conductive layer 21 on the first principal surface 15, and FIG. 7B the plurality of back-side pads 25 on the second principal surface 23.

Depending on the inspection target, respective probes are connected to the front-side pads 19 of the IC inspection apparatus substrate 1, whereby the IC inspection apparatus substrate 1 is used.

In the embodiment, the through holes 35 that are greater in number than the front-side pads 19 (i.e., a predetermined number of through holes 35 that are greater in number than the expected number of vias 11) are formed at predetermined locations on the large-size green sheet 33 (locations corresponding to the respective mother ceramic substrates 47) by use of a single metal mold. The large-size green sheet 33 is separated along the first line L1 corresponding to the green sheet 31 of the mother ceramic substrate 47. Subsequently, the thus-separated green sheet 31 is sintered, to thus produce the mother ceramic substrate 47. The thus-produced mother ceramic substrate 47 is stocked. According to the specifications, the front-side pads 19 and the surface conductive layer 21 are formed over the mother ceramic substrate 47, and the back-side pads 25 are also formed on the same. The mother ceramic substrate 47 is then separated along the third line L3, thereby completing the IC inspection apparatus substrate 1.

As mentioned above, the mother ceramic substrate 47 (having the plurality of vias 11) that is larger than the IC inspection apparatus substrate 1 is prepared prior to production of the IC inspection apparatus substrate 1. According to the specifications, the front-side pads 19 and the surface conductive layer 21 are formed over the mother ceramic substrate 47. The mother ceramic substrate 47 is trimmed to a defined outside dimension to manufacture the IC inspection apparatus substrate 1. Thus, when compared with manufacturing the related-art's IC inspection apparatus substrate, the substrate 1 can be manufactured in more inexpensively and in a shorter amount of time.

Specifically, the large-size mother ceramic substrate 47 having a larger number of vias 11 than the number of commonly-available front-side pads 19 is prepared in advance and stocked. This obviates the necessity for manufacturing a plurality of metal molds corresponding to different sizes of vias and different via layouts, which has hitherto been required. Hence, it is possible to reduce the time and cost incurred in manufacturing a metal mold and, by extension, the cost and time incurred in manufacturing an IC inspection apparatus substrates 1.

Accordingly, even when the target IC inspection apparatus substrate 1 has a different size or when the through holes 35 (which define the vias 11) assume different positions, there will be yielded an advantage of a single metal mold being usable. Therefore, there is also yielded an advantage of the cost and time incurred in manufacturing a metal mold being reduced.

Further, the vias 11 that are greater in number than the expected number of front-side pads 19 are prepared in advance, which yields an advantage of the ability to easily connect the front-side pads 19 to the vias 11 by means of a surface conductive layer 21. Specifically, since there are a large number of vias 11, there will be yielded an advantage that the front-side pads 19 can be sufficiently connected for different specifications regardless of the positions or number of front-side pads required.

The present invention is not limited to the above-described embodiment. Needless to say, the present invention can be put into practice in various forms without departing from the scope of the invention.

For instance, in the present embodiment, the plurality of green sheets corresponding to the respective IC inspection apparatus substrates are separated from the large-size green sheet. However, a single green sheet corresponding to one IC inspection apparatus substrate can also be used.

A green sheet area for an IC inspection apparatus substrate having a single pad pattern can be set on a large-size green sheet, or a green sheet area for an IC inspection apparatus substrate having a different pad pattern can also be set.

In the present embodiment, front-side pads are provided on either side (e.g., in an outer periphery) of the via formation area (e.g., center area). However, the front-side pads can also be arranged so as to surround the entire (four sides) or three sides of the via formation area.

In the present embodiment, the front-side pads and the surface conductive layer are simultaneously formed. However, formation of the front-side pads and the surface conductive layer can also be performed in different processes. For instance, after formation of the front-side pads, the surface conductive layer can also be formed so as to connect the vias to the front-side pads.

In the present embodiment, after the pads and the surface conductive layer are formed over the mother ceramic substrate, the mother ceramic substrate is trimmed so as to assume a defined outside dimension, whereby the IC inspection apparatus substrate is produced. However, the pads and the surface conductive layer can also be formed after the mother ceramic substrate is trimmed to a defined outside dimension.

Description of Reference Numerals
1: IC INSPECTION APPARATUS SUBSTRATE
9: PROBE
11: VIA
13: SUBSTRATE BODY
15: FIRST PRINCIPAL SURFACE
19: FRONT-SIDE PAD
21: SURFACE CONDUCTIVE LAYER
23: SECOND PRINCIPAL SURFACE
25: BACK-SIDE PAD
35: THROUGH HOLE (PENETRATION HOLE)
47: MOTHER CERAMIC SUBSTRATE

What is claimed is:

1. A ceramic substrate configured to connect to probes for inspecting an electronic component, the ceramic substrate comprising:
   a plurality of vias located in a center area of the ceramic substrate in a planar direction and that penetrate through the ceramic substrate in its thicknesswise direction;
   pads configured to connect to the probes, at least a portion of the pads being located in an outer periphery that surrounds the center area where the vias are located; and
   a conductive layer located only over a front surface of the ceramic substrate, wherein the conductive layer connects all of the pads to the vias;
   wherein there is a greater number of the vias than the pads.

2. The ceramic substrate of claim 1, wherein all of the pads are located in the outer periphery that surrounds the center area where the vias are located.

3. A method for manufacturing a ceramic substrate having pads configured to connect to probes for inspecting an electronic component, the method comprising:
   a first step of forming a plurality of via-filled portions that are filled with a via material on a ceramic green sheet;
   a second step of sintering the ceramic green sheet to form a mother ceramic substrate having a plurality of vias;
   a third step of forming the pads, which are configured to connect to the probes, and a conductive layer, which connects all of the pads to the vias over a front surface of the mother ceramic substrate; and
   a fourth step of trimming the mother ceramic substrate to produce the ceramic substrate;
   wherein there is a greater number of the vias than the pads, and wherein at least a portion of the pads are located in an outer periphery of the ceramic substrate that surrounds a center area where the vias are located.

4. The method for manufacturing a ceramic substrate according to claim 3, further comprising:
   a separating step of separating one or more ceramic green sheets that respectively correspond to mother ceramic substrates from a large-size ceramic green sheet before the first step;
   wherein the ceramic green sheet after the separating step has an outside dimension corresponding to that of the mother ceramic substrate whose outside dimension is larger than that of the ceramic substrate.

5. The method for manufacturing a ceramic substrate according to claim 3, wherein all of the pads are located in the outer periphery that surrounds the center area where the vias are located.

* * * * *